United States Patent
Tsutsumi et al.

(10) Patent No.: US 9,166,112 B2
(45) Date of Patent: Oct. 20, 2015

(54) LIGHT EMITTING MODULE, METHOD OF MANUFACTURING THE LIGHT EMITTING MODULE, AND LAMP UNIT

(75) Inventors: Yasuaki Tsutsumi, Shizuoka (JP); Hisayoshi Daicho, Shizuoka (JP); Takaaki Komatsu, Shizuoka (JP)

(73) Assignee: KOITO MANUFACTURING CO., LTD., Tokyo (JP)

(*) Notice: Subject to any disclaimer, the term of this patent is extended or adjusted under 35 U.S.C. 154(b) by 727 days.

(21) Appl. No.: 13/124,395

(22) PCT Filed: Oct. 9, 2009

(86) PCT No.: PCT/JP2009/005292
§ 371 (c)(1), (2), (4) Date: Apr. 15, 2011

(87) PCT Pub. No.: WO2010/044239
PCT Pub. Date: Apr. 22, 2010

(65) Prior Publication Data
US 2011/0204405 A1    Aug. 25, 2011

(30) Foreign Application Priority Data
Oct. 17, 2008   (JP) ................................ 20080269177

(51) Int. Cl.
| H01L 33/00 | (2010.01) |
| H01L 21/00 | (2006.01) |
| H01L 33/46 | (2010.01) |
| F21S 8/10  | (2006.01) |
| H01L 33/50 | (2010.01) |
| H01L 33/58 | (2010.01) |

(52) U.S. Cl.
CPC ............. *H01L 33/46* (2013.01); *F21S 48/1159* (2013.01); *F21S 48/1208* (2013.01); *F21S 48/321* (2013.01); *F21S 48/328* (2013.01); *H01L 33/505* (2013.01); *H01L 33/58* (2013.01)

(58) Field of Classification Search
CPC ......... H01L 33/44; H01L 33/50; H01L 33/46; H01L 33/58; H01L 33/505
USPC ........................................................... 257/98
See application file for complete search history.

(56) References Cited

U.S. PATENT DOCUMENTS

| 5,813,752 | A  | * | 9/1998 | Singer et al. ................... 362/293 |
| 2008/0123339 | A1 | * | 5/2008 | Bierhuizen et al. ........... 362/293 |
| 2010/0019265 | A1 | * | 1/2010 | Sormani et al. ................. 257/98 |

FOREIGN PATENT DOCUMENTS

| JP | 2000171625  | 6/2000  |
| JP | 2000-515689 | 11/2000 |

(Continued)

OTHER PUBLICATIONS

Hayashi, Light emitting device has resin material between LED chip and plate-shaped structure containing fluorescent substance for emitting wavelength-converted light, Dec. 27, 2007, Derwent 2008-C26903.*

(Continued)

*Primary Examiner* — Whitney T Moore
*Assistant Examiner* — Joseph Galvin, III
(74) *Attorney, Agent, or Firm* — Buchanan Ingersoll & Rooney PC

(57) ABSTRACT

In a light emitting module 40, a light wavelength conversation ceramic 52 converts the wavelength of the light emitted by a semiconductor light emitting element 48 then emits the light. An optical filter 50 transmits the blue light Lb mainly emitted by the semiconductor light emitting element 48 and reflects the yellow light Ly whose wavelength has been mainly converted by the light wavelength conversion ceramic 52. The optical filter 50 is provided on the surface of the light wavelength conversion ceramic 52. The light emitting module 40 is manufactured by: the process where the optical filter 50 is provided on at least one surface of the light wavelength conversion ceramic 52; and the process where the semiconductor light emitting element 48 and the light wavelength conversion ceramic 52 are arranged such that the light emitted by the semiconductor light emitting element 48 is incident into the light wavelength conversion ceramic 52.

14 Claims, 5 Drawing Sheets

(56) References Cited

FOREIGN PATENT DOCUMENTS

| | | |
|---|---|---|
| JP | 3467016 | 8/2003 |
| JP | 2003-535477 A | 11/2003 |
| JP | 2004-031843 | 1/2004 |
| JP | 2004-071726 A | 3/2004 |
| JP | 2006-005367 | 1/2006 |
| JP | 2006-278567 | 10/2006 |
| JP | 2007-059864 | 3/2007 |
| JP | 2007-305575 | 11/2007 |
| JP | 2007-335798 | 12/2007 |
| JP | 2008-004645 A | 1/2008 |
| JP | 2008-118071 | 5/2008 |
| JP | 2008-235827 | 10/2008 |
| WO | 98/05078 A1 | 2/1998 |
| WO | 00/26701 A1 | 5/2000 |
| WO | 01/93341 A1 | 12/2001 |
| WO | 2008/018002 A2 | 2/2008 |
| WO | 2009101659 | 8/2009 |

OTHER PUBLICATIONS

JPO, Office Action in counterpart application JP 2010-533816 dated Feb. 26, 2013.
Chinese Office Action, Jul. 3, 2012, 7 pages.
International Preliminary Report on Patentability for International Application No. PCT/JP2009/005292, International Filing Date Oct. 9, 2009.
Translation of International Preliminary Report on Patentability for International Application No. PCT/JP2009/005292, International Filing Date Oct. 9, 2009.
International Search Report for International International Application No. PCT/JP2009/005292, International Filing Date Oct. 9, 2009.
Translation of International Search Report for International International Application No. PCT/JP2009/005292, International Filing Date Oct. 9, 2009.
Office Action (Decision of Refusal) issued Nov. 5, 2013, by the Japanese Patent Office in corresponding Japanese Patent Application No. 2010-533816, and an English Translation of the Office Action. (4 pages).
European Supplementary Search Report dated Aug. 19, 2014 issued in corresponding European Patent Application No. 09820417.5-1564/2357677. (7 pages).
Japanese Notification of Reason(s) for Refusal dated Nov. 18, 2014 issued in corresponding Japanese Patent Application No. 2010-533816 and English translation (10 pages).
Japanese Appeal Decision dated Mar. 24, 2015 issued in the corresponding Japanese Patent Application No. 2010-533816 and English translation (15 pages).

* cited by examiner

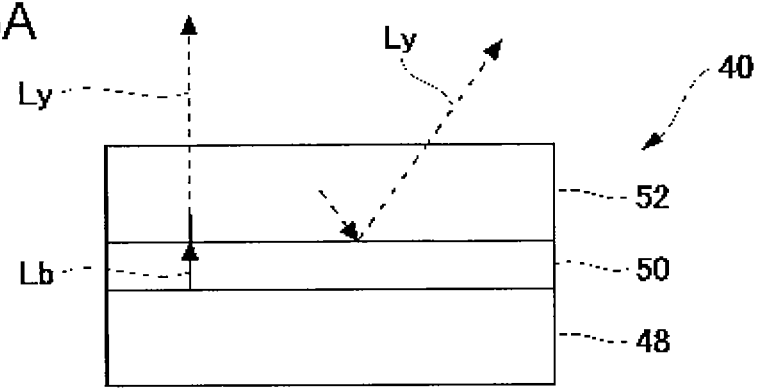
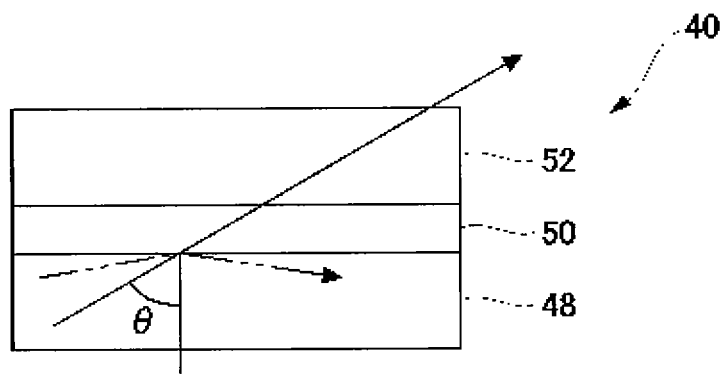

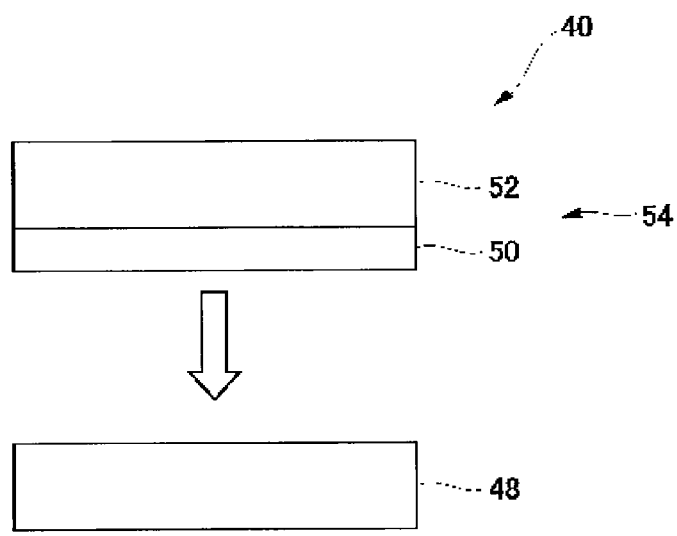
FIG. 4A
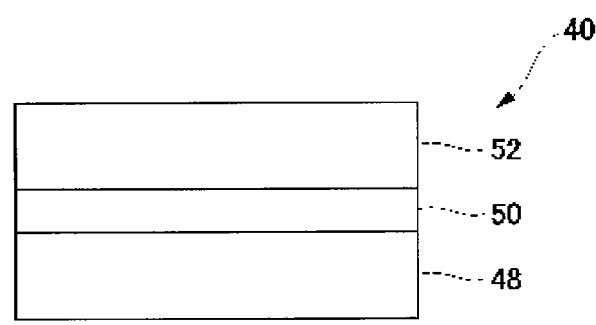
FIG. 4B
FIG. 5
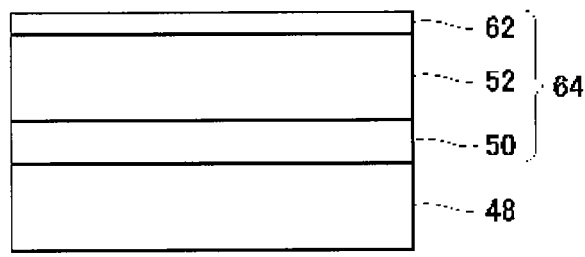

LIGHT EMITTING MODULE, METHOD OF MANUFACTURING THE LIGHT EMITTING MODULE, AND LAMP UNIT

CROSS-REFERENCES TO RELATED APPLICATIONS

This is a U.S. national phase of PCT/JP2009/005292, filed 9 Oct. 2009, claiming priority from Japanese Application No. JP2008-269177, filed 17 Oct. 2008.

FIELD OF THE INVENTION

The present invention relates to a light emitting module, a method of manufacturing the light emitting module, and a lamp unit comprising the light emitting module.

BACKGROUND ART

In recent years, for the purpose of long life or reduction in power consumption, a technique has been developed in which a light emitting module having a light emitting element, such as an LED (Light Emitting Diode), is adopted as a light source for emitting strong light, such as a lamp unit that emits light toward the front of a vehicle. However, the light emitting module to be used in such an application is required to have high luminance and high light intensity. Accordingly, in order to improve, for example, the extraction efficiency of while light, a lighting system comprising: a light emitting element that mainly emits blue light; a yellow phosphor that mainly emits yellow light by being excited with the blue light; and a blue-transmitting yellow-reflecting means that transmits the blue light from the light emitting element and reflects the light with a wavelength of the yellow light or more from the yellow phosphor, is proposed (see, for example, Patent Document 1). In addition, in order to enhance, for example, the conversion efficiency, a structure comprising a ceramic layer arranged within the channel of the light emitted by a light emitting layer is proposed (see, for example, Patent Document 2).

[Patent Document 1] Japanese Patent Application Publication No. 2007-59864

[Patent Document 2] Japanese Patent Application Publication No. 2006-5367

DISCLOSURE OF THE INVENTION

Problem to be Solved by the Invention

In recent years, LEDs have been increasingly used in wide range of applications, and it is demanded to properly deal with an increase in the production volume of light emitting modules including LEDs. Therefore, simplification of the manufacturing process for the light emitting module including an LED becomes an important issue in this technical field.

Thus, the present invention has been made to solve the aforementioned issue, and a purpose of the invention is to effectively use the light emitted by a light emitting element and to achieve the simplification of the manufacturing process for the light emitting module including the light emitting element.

Means for Solving the Problem

In order to solve the aforementioned issue, a light emitting module according to an embodiment of the present invention comprises: a light emitting element configured to emit a light having a main wavelength within a certain range; a light wavelength conversion member configured to convert the wavelength of the light emitted by the light emitting element then emit the light; and an optical filter configured to transmit a light with the main wavelength emitted by the light emitting element and reflect a light with a main wavelength which has been converted by the light wavelength conversion member. The light wavelength conversion member is formed into a plate shape and the optical filter is provided on the surface of the light wavelength conversion member.

According to the embodiment, a light emitting module can be manufactured in a simplified process where a plate-shaped light wavelength conversion member, on the surface of which an optical filter is provided, is arranged near to a light emitting element. Accordingly, the manufacturing process for the light emitting module can be simplified in comparison with, for example, the case where an optical filter and a light wavelength conversion member are sequentially laminated above a light emitting element.

The light emitting element may be provided so as to emit a light having a main wavelength within the ultraviolet region. According to the embodiment, it can be suppressed that the color of the light emitted by the light emitting element may affect the color of the light to be emitted, by using a light wavelength conversion member configured to convert the light having a main wavelength within the ultraviolet region into the light with a wavelength within the visible light region. Accordingly, the range of the light emitted by the light emitting module can be expanded.

The optical filters may be provided, of the surfaces of the light wavelength conversion member, on the incident surface on which light is to be incident and on the side surface located between the edge of the incident surface and that of the emitting surface from which light is to be emitted. The light wavelength conversion member may be arranged such that the light emitted by the light emitting element transmits the optical filter to be incident on the incident surface. According to the embodiment, leak of the light from the side surface can be suppressed. Accordingly, the light emitted by the light emitting element can be used more efficiently, and thereby the luminance of the light emitted by the light emitting module can be further enhanced.

Another embodiment of the present invention is a method of manufacturing a light emitting module. The method is a method of manufacturing a light emitting module having a light emitting element and comprises: providing an optical filter that transmits a light with a main wavelength emitted by the light emitting element and reflects a light with a main wavelength which has been converted by a plate-shaped light wavelength conversion member, on at least one surface of the light wavelength conversion member that converts the wavelength of the incident light then emits the light; and arranging the light emitting element and the light wavelength conversion member such that the light emitted by the light emitting element is incident into the light wavelength conversion member.

According to the embodiment, a light emitting module can be manufactured in a simplified process where a plate-shaped light wavelength conversion member is provided near to a light emitting element, by beforehand providing an optical filter on the light wavelength conversion member. Accordingly, the manufacturing process for the light emitting module can be simplified in comparison with, for example, the case where an optical filter and a light wavelength conversion member are sequentially laminated above a light emitting element.

In the providing an optical filter, the optical filters may be provided, of the surfaces of the light wavelength conversion member, on the incident surface on which the light from the light emitting element is to be incident and on the side surface located between the edge of the incident surface and that of the emitting surface from which light is to be emitted. In the arranging a light emitting element and a light wavelength conversion member, the light emitting element and the light wavelength conversion member may be arranged such that the light emitted by the light emitting element transmits the optical filter to be incident on the incident surface of the light wavelength conversion member.

According to the embodiment, optical filters can be provided beforehand on the incident surface and the side surface of a light wavelength conversion member. Accordingly, a light emitting module can be simply manufactured in comparison with, for example, the case where an optical filter is provided on the incident surface and a reflective layer different from the optical filter is provided on the side surface.

Still another embodiment of the present invention is a lamp unit. The lamp unit comprises: a light emitting module including a light emitting element configured to emit a light having a main wavelength within a certain range, a light wavelength conversion member configured to convert the wavelength of the light emitted by the light emitting element then emit the light, and an optical filter configured to transmit a light with the main wavelength emitted by the light emitting element and reflect a light with a main wavelength which has been converted by the light wavelength conversion member; and an optical member configured to collect the light emitted from the light emitting module. The light wavelength conversion member is formed into a plate shape and the optical filter is provided on the surface of the light wavelength conversion member.

According to the embodiment, a lamp unit can be manufactured by using a light emitting module that has been manufactured in a simplified manufacturing process. Accordingly, the cost of the whole lamp unit can be reduced.

Still another embodiment of the present invention is a light emitting module. The light emitting module comprises: a light emitting element configured to emit a light having a main wavelength within a certain range; a transparent light wavelength conversion member configured to convert the wavelength of the light emitted by the light emitting element then emit the light; and an optical filter configured to transmit a light with the main wavelength emitted by the light emitting element and reflect a light with a main wavelength which has been converted by the light wavelength conversion member.

According to the embodiment, a decrease in the light intensity, occurring when light is transmitting the inside of the light wavelength conversion member, can be suppressed because the light wavelength conversion member is transparent. Accordingly, the light emitted by the light emitting element can be used efficiently.

The light wavelength conversion member may have 40 percent or more of the total light transmittance of the light with a wavelength within the conversion wavelength range.

As a result of the intensive research and development by the inventors, it has been found that, when a light wavelength conversion member is so transparent that the total light transmittance of the light with a wavelength within the conversion wavelength range of the light wavelength conversion member is 40 percent or more, proper conversion of the wave length of light by the light wavelength conversion member and suppression of a decrease in the light intensity of the light transmitting the light wavelength conversion member can be both satisfied. Therefore, according to the embodiment, it becomes possible to properly convert the wavelength of the light transmitting a light wavelength conversion member while a decrease in the light intensity of the light is being suppressed.

The optical filter may have a higher transmittance than a reflectance with respect to the light having a wavelength within a predetermined overlapping wavelength range where the wavelength range of the light emitted by the light emitting element and that of the light converted by the light wavelength conversion member are overlapped with each other.

As a result of the intensive research and development by the inventors, it has been found that both conversion of the wavelength of light by a light wavelength conversion member and the use efficiency of the light can be properly satisfied by making the transmittance of an optical filter higher than the reflectance thereof in such an overlapping wavelength range. Therefore, according to the embodiment, it becomes possible to properly convert the wavelength of the light transmitting a light wavelength conversion member while a decrease in the conversion efficiency of the light is being suppressed.

The light emitting module may further comprise a light diffusion member provided on at least one surface of the light wavelength conversion member. Alternatively, the light wavelength conversion member may be formed such that light is diffused by at least one surface thereof.

According to the embodiment, the light emitted from the light wavelength conversion member can be diffused, and thereby the non-uniformity of the light emitted by the light emitting module can be suppressed.

Even in the embodiment, the light emitting element may also be provided so as to emit a light having a main wavelength within the ultraviolet region. Also, the optical filters may be provided, of the surfaces of the light wavelength conversion member, on the incident surface on which light is to be incident and on the side surface located between the edge of the incident surface and that of the emitting surface from which light is to be emitted. The light wavelength conversion member may be arranged such that the light emitted by the light emitting element transmits the optical filter to be incident on the incident surface.

Still another embodiment of the present invention is a lamp unit. The lamp unit comprises: a light emitting module including a light emitting element configured to emit a light having a main wavelength within a certain range, a transparent light wavelength conversion member configured to convert the wavelength of the light emitted by the light emitting element then emit the light, and an optical filter configured to transmit a light with the main wavelength emitted by the light emitting element and reflect a light with a main wavelength which has been converted by the light wavelength conversion member; and an optical member configured to collect the light emitted from the light emitting module.

When a light wavelength conversion member is made transparent, a decrease in the light intensity, occurring when light is transmitting the inside thereof, can be suppressed. Making a light wavelength conversion member transparent as stated above can be achieved by forming a light wavelength conversion member with, for example, a ceramic material instead of a fluorescent material, etc. Therefore, according to the embodiment, the light emitted by the light emitting element can be used efficiently. In addition, in the same way as described above, the light wavelength conversion member may have 40 percent or more of the total light transmittance of the light with a wavelength within the conversion wavelength range.

Advantage of the Invention

According to the present invention, the light emitted by a light emitting element can be used effectively and simplification of the manufacturing process for the light emitting module including the light emitting element can be achieved.

BRIEF DESCRIPTION OF THE DRAWINGS

FIG. 3(a) is a view illustrating the characteristic of an optical filter according to the first embodiment, for transmission and reflection of light;

FIG. 3(b) is a view illustrating the maximum incident angle for transmitting the optical filter according to the first embodiment;

FIG. 4(a) is a view illustrating a light emitting module in the middle of being manufactured;

FIG. 4(b) is a view illustrating the light emitting module that has been manufactured;

FIG. 5 is a view illustrating the configuration of a light emitting module according to a second embodiment;

REFERENCE NUMERALS

10 AUTOMOTIVE HEADLAMP
38 LIGHT EMITTING MODULE SUBSTRATE
40 LIGHT EMITTING MODULE
42 RADIATING FINS
44 SUBSTRATE
46 TRANSPARENT COVER
48 SEMICONDUCTOR LIGHT EMITTING ELEMENT
50 OPTICAL FILTER
52 LIGHT WAVELENGTH CONVERSION CERAMIC
54 CERAMIC UNIT
60 LIGHT EMITTING MODULE
62 LIGHT DIFFUSION PANEL
70 LIGHT EMITTING MODULE
72 SUBSTRATE
74 OPTICAL FILTER MODULE
80 LIGHT EMITTING MODULE
82 OPTICAL FILTER
84 LIGHT WAVELENGTH CONVERSION CERAMIC
86 CERAMIC UNIT
90 LIGHT EMITTING MODULE
92 ULTRAVIOLET RAY EMITTING ELEMENT
94 OPTICAL FILTER
96 LIGHT WAVELENGTH CONVERSION CERAMIC

BEST MODE FOR CARRYING OUT THE INVENTION

Preferred embodiments will now be described in detail with reference to accompanying drawings.

First Embodiment

Figure 1:
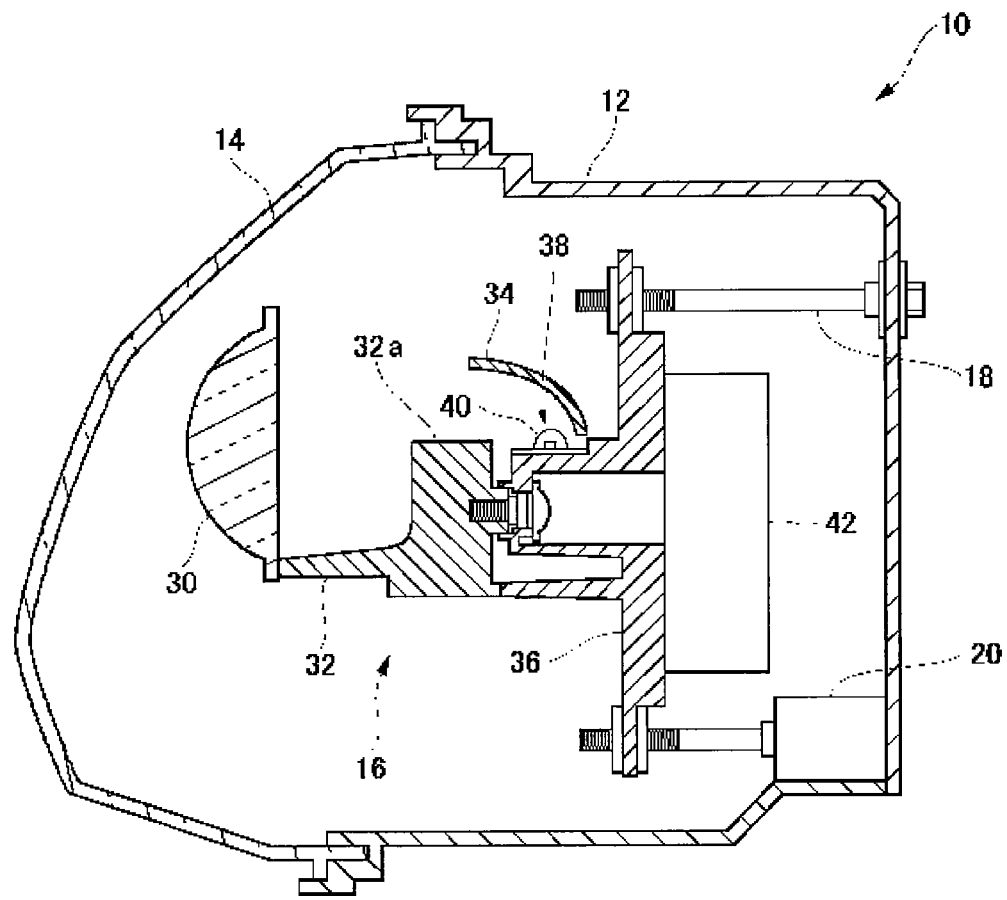
FIG. 1 is a sectional view illustrating the configuration of an automotive headlamp according to a first embodiment.

FIG. 1 is a sectional view illustrating the configuration of an automotive headlamp 10 according to a first embodiment. The automotive headlamp 10 has a lamp body 12, a front cover 14, and a lamp unit 16. Hereinafter, descriptions will be made, assuming that the left side in FIG. 1 is the front of the lamp and the right side therein is the back thereof. In addition, when viewing the front of the lamp, the right side is referred to as the right side of the lamp and the left side as the left side thereof. FIG. 1 illustrates the cross section of the automotive headlamp 10 cut by the vertical plane including the light axis of the lamp unit 16, when viewed from the left side of the lamp. When the automotive headlamp 10 is to be mounted in a vehicle, the automotive headlamps 10, which are formed symmetrically with each other, are provided in the left and right front portions of the vehicle, respectively. FIG. 1 illustrates the configuration of either of the left and right automotive headlamps 10.

The lamp body 12 is formed into a box shape having an opening. The front cover 14 is formed into a bow shape with a resin having translucency or glass. The front cover 14 is installed such that the edge thereof is attached to the opening of the lamp body 12. In such a manner, a lamp chamber is formed in the area covered with the lamp body 12 and the front cover 14.

The lamp unit 16 is arranged in the lamp chamber. The lamp unit 16 is fixed to the lamp body 12 with aiming screws 18. The aiming screw 18 in the lower portion is configured to be rotatable by an operation of a leveling actuator 20. Accordingly, the light axis of the lamp unit 16 can be moved in the up-down direction by operating the leveling actuator 20.

The lamp unit 16 has a projection lens 30, a support member 32, a reflector 34, a bracket 36, a light emitting module substrate 38, and a radiating fin 42. The projection lens 30 is composed of a plano-convex aspheric lens, the front surface of which is convex-shaped and the back surface of which is flat-shaped, and projects a light source image that is formed on the back focal plane toward the front of the vehicle as an inverted image. The support member 32 supports the projection lens 30. A light emitting module 40 is provided on the light emitting module substrate 38. The reflector 34 reflects the light emitted from the light emitting module 40 to form the light source image on the back focal plane of the projection lens 30. As stated above, the reflector 34 and the projection lens 30 function as optical members that collect the light emitted by the light emitting module 40 toward the front of the lamp. The radiating fin 42 is installed onto the back surface of the bracket 36 to radiate the heat mainly generated by the light emitting module 40.

A shade 32a is formed on the support member 32. The automotive headlamp 10 is used as a light source for low-beam, and the shade 32a forms, in front of the vehicle, a cut-off line in the light distribution pattern for low-beam by shielding part of the light that has been emitted from the light emitting module 40 and reflected by the reflector 34. Because the light distribution pattern for low-beam is publicly known, descriptions thereof will be omitted.

Figure 2:
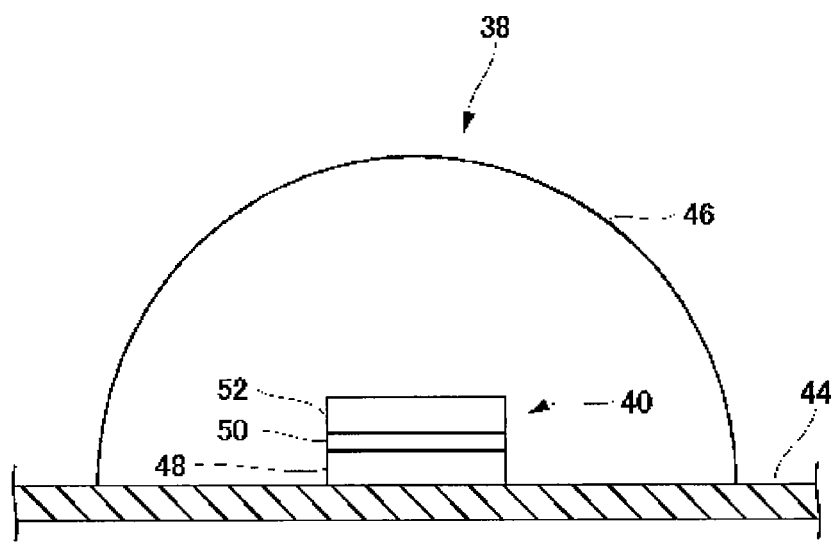
FIG. 2 is a view illustrating the configuration of a light emitting module substrate according to the first embodiment.

FIG. 2 is a view illustrating the configuration of the light emitting module substrate 38 according to the first embodiment. The light emitting module substrate 38 has the light emitting module 40, a substrate 44, and a transparent cover 46. The substrate 44 is a printed circuit board, onto the upper surface of which the light emitting module 40 is attached. The light emitting module 40 is covered with a colorless transparent cover 46.

The light emitting module 40 is provided such that a semiconductor light emitting element 48, an optical filter 50, and a light wavelength conversion ceramic 52 are laminated. Specifically, the semiconductor light emitting element 48 is directly attached onto the substrate 44, and the optical filter 50 and the light wavelength conversion ceramic 52 are laminated on the semiconductor light emitting element 48 in this order.

The semiconductor light emitting element 48 is composed of an LED element. In the first embodiment, a blue LED mainly emitting the light with a blue wavelength is adopted as the semiconductor light emitting element 48. Specifically, the semiconductor light emitting element 48 is composed of an InGaN LED element that has been formed by subjecting an InGaN semiconductor layer to crystal growth on a sapphire substrate. The semiconductor light emitting element 48 is formed as, for example, a square chip having a size of 1 mm×1 mm, and is provided such that the central wavelength of the emitted blue light is 470 nm. It is needless to say that the configuration of the semiconductor light emitting element 48 and the wavelength of the light to be emitted should not be limited to what have been stated above.

FIG. 3(*a*) is a view illustrating the characteristic of the optical filter 50 according to the first embodiment, for transmission and reflection of light. The light wavelength conversion ceramic 52 is so-called luminescence ceramic or fluorescent ceramic, and can be obtained by sintering the ceramic green body made of YAG (Yttrium Alminium Garnet) powder that is a phosphor to be excited by blue light. Because a method of manufacturing such light wavelength conversion ceramic is publicly known, detailed descriptions thereof will be omitted.

The light wavelength conversion ceramic 52 thus obtained converts the wavelength of the blue light Lb mainly emitted by the semiconductor light emitting element 48 then emits the yellow light Ly. Accordingly, synthesized light that has been synthesized from both the blue light Lb that has transmitted, as it is, the light wavelength conversion ceramic 52 and the yellow light Ly whose wavelength has been converted by the light wavelength conversion ceramic 52, is emitted from the light emitting module 40. Thus, white light can be emitted from the light emitting module 40.

Transparent ceramic is adopted as the light wavelength conversion ceramic 52. The "to be transparent" in the first embodiment means that the total light transmittance of the light with a wavelength within the conversion wavelength range is 40 percent or more. As a result of the intensive research and development by the inventors, it has been found that, when the light wavelength conversion ceramic 52 is so transparent that the total light transmittance of the light with a wavelength within the conversion wavelength range is 40 percent or more, the wavelength of light can be properly converted by the light wavelength conversion ceramic 52 and a decrease in the light intensity of the light transmitting the light wavelength conversion ceramic 52 can be properly suppressed. It has also been found that, when the total light transmittance of the light wavelength conversion ceramic 52 is 50 percent or more, and preferably 60 percent or more, good results can be obtained in the conversion of the wavelength of light and suppression of a decrease in the light intensity. Accordingly, the wavelength of the light emitted by the semiconductor light emitting element 48 can be efficiently converted by making the light wavelength conversion ceramic 52 transparent as stated above.

A transmittance can be measured by, for example, a spectro-transmission meter provided with an integrating sphere in the photoreceiver, such as spectrophotometer Solid Spec 3700 made by Shimadzu Corporation. In the first embodiment, spectral light to be measured was radiated to the light wavelength conversion ceramic 52 that has been installed into the opening of the integrating sphere, and the light that had transmitted the integrating sphere to a spectral sphere was measured by a photoreceiver.

The light wavelength conversion ceramic 52 is composed of an inorganic substance without binder such that the durability thereof is enhanced in comparison with the case where an organic substance, such as binder, is included. Accordingly, it becomes possible to supply the power of, for example, 1 W or more to the light emitting module 40, and thereby the luminance and light intensity of the light emitted by the light emitting module 40 can be enhanced.

A semiconductor light emitting element emitting the light having a main wavelength other than blue may be adopted as the semiconductor light emitting element 48. In this case, a light wavelength conversion ceramic for converting the main wavelength of the light emitted by the semiconductor light emitting element 48 is also adopted as the light wavelength conversion ceramic 52. Also, in this case, the light wavelength conversion ceramic 52 may convert the wavelength of the light emitted by the semiconductor light emitting element 48 such that the light with a wavelength of white or close to white is emitted by combining with the light with the main wavelength emitted by the semiconductor light emitting element 48.

The optical filter 50 transmits the blue light Lb mainly emitted by the semiconductor light emitting element 48. In addition, the optical filter 50 reflects the yellow light Ly mainly emitted by the light wavelength conversion ceramic 52 that has converted the wavelength of the blue light Lb. Most of the light emitted by the semiconductor light emitting element 48 can be first emitted to the light wavelength conversion ceramic 52 by arranging the optical filter 50 between the semiconductor light emitting element 48 and the light wavelength conversion ceramic 52. Further, the light of a yellow wavelength travelling toward the semiconductor light emitting element 48, occurring due to the diffusion of light when the wavelength of the light is converted by the light wavelength conversion ceramic 52, can be reflected. Accordingly, the light emitted by the semiconductor light emitting element 48 can be used efficiently, and thereby a decrease in the light intensity or luminance of the light emitted by the light emitting module 40 can be suppressed.

In the first embodiment, the "to transmit" means that the light intensity after transmission is 50 percent or more of that prior to the transmission. In addition, the "to reflect" means that the light intensity after reflection is 50 percent or more of that prior to the reflection.

The optical filter 50 is provided so as to have a higher a transmittance than a reflectance with respect to the light having a wavelength within a predetermined overlapping wavelength range where the wavelength range of the light emitted by the semiconductor light emitting element 48 and that of the light converted by the light wavelength conversion ceramic 52 are overlapped with each other. As a result of the intensive research and development by the inventors, it has been found that the light emitted by the semiconductor light emitting element 48 can be used efficiently by making a transmittance higher than a reflectance in such an overlapping wavelength range, while the wavelength of the light is being properly converted by the light wavelength conversion ceramic 52. Accordingly, the wavelength of the light, which is transmitting the light wavelength conversion ceramic 52, can be properly converted while a decrease in the efficiency of the conversion of the light is being suppressed.

FIG. 3(*b*) is a view illustrating the maximum incident angle for transmitting the optical filter 50 according to the first embodiment. The optical filter 50 is provided such that the maximum incident angle θ for transmission is 45 degrees or more and less than 90 degrees. The optical filter 50 is preferably provided such that the maximum incident angle θ for transmission is 50 degrees or more and less than 90 degrees, and more preferably provided such that the angle θ is 55 degrees or more and less than 90 degrees. As a result of the intensive research and development by the inventors, it has been found that a decrease in the light intensity of the light travelling toward the light wavelength conversion ceramic 52 is effectively suppressed by setting the maximum incident angle θ for transmitting the optical filter 50 to such a value. Accordingly, it can be avoided that the use efficiency of the light emitted by the semiconductor light emitting element 48 may be decreased, by providing the optical filter 50.

FIGS. 4(a) and 4(b) are views illustrating the manufacturing process of the light emitting module 40 according to the first embodiment, and FIG. 4(a) illustrates the light emitting module 40 in the middle of being manufactured.

In the first embodiment, the light wavelength conversion ceramic 52 is formed into a plate shape and the optical filter 50 is provided on one surface of the light wavelength conversion ceramic 52. In the first embodiment, the optical filter 50 is composed of a multi-layered dichroic mirror that has been formed by alternately vapor-depositing and laminating materials having refractive indexes different from each other on one surface thereof. It is needless to say that the optical filter 50 should not be limited to what has been described above, and, for example, a long pass filter, short pass filter, or band pass filter may be adopted.

A ceramic unit 54 is formed by providing the optical filter 50 on one surface of the plate-shaped semiconductor light wavelength conversion ceramic 52 as stated above. Because the ceramic unit 54 thus formed has a plate shape, handling of the light emitting module 40 during manufacture becomes easy in comparison with, for example, the case where a powdered wavelength conversion material is used.

Subsequently, the ceramic unit 54 is arranged above the semiconductor light emitting element 48 such that the optical filter 50 is in contact with the upper surface of the semiconductor light emitting element 48, from the upper surface light being emitted. The ceramic unit 54 may be fixed to the upper surface of the semiconductor light emitting element 48 by adhesion or another fixing method. Alternatively, a space may be provided between the upper surface of the semiconductor light emitting element 48 and the lower surface of the optical filter 50. Thus, the semiconductor light emitting element 48 and the light wavelength conversion ceramic 52 are arranged such that the light emitted by the semiconductor light emitting element 48 transmits the optical filter 50 to be incident into the light wavelength conversion ceramic 52.

FIG. 4(b) is a view illustrating the light emitting module 40 that has been manufactured. As stated above, it becomes possible to manufacture the light emitting module 40 in a simplified process by forming the ceramic unit 54 with the optical filter 50 being provided beforehand on one surface of the plate-shaped light wavelength conversion ceramic 52. Accordingly, the light emitting module 40 can be simply manufactured in comparison with, for example, the case where an optical filter is laminated above the semiconductor light emitting element 48 and a light wavelength conversion material, which is a powdered phosphor, is further laminated.

Second Embodiment

FIG. 5 is a view illustrating the configuration of a light emitting module 60 according to a second embodiment. The configuration of the automotive headlamp 10 is the same as that in the first embodiment, except that the light emitting module 60 is provided instead of the light emitting module 40. Hereinafter, the parts similar to the first embodiment will be denoted with the same reference numerals and descriptions thereof will be omitted.

In the light emitting module 60, a light diffusion plate 62 is further provided on the upper surface of the light wavelength conversion ceramic 52. The light emitting module 60 has the same configuration as that of the light emitting module 40, except that the light diffusion plate 62 is provided. Because the non-uniformity of the light emitted by the semiconductor light emitting element 48 is likely to be transmitted outside as it is, by making the light wavelength conversion ceramic 52 transparent, the possibility that non-uniformity may occur in the light emitted by the light emitting module 40 becomes high. The non-uniformity of the light emitted by the light emitting module 40 can be suppressed by providing the light diffusion plate 62 as stated above.

In manufacturing the light emitting module 60, the ceramic unit 64 is first formed by beforehand providing the optical filter 50 on one surface of the light wavelength conversion ceramic 52 and the light diffusion plate 62 on the other surface thereof. Subsequently, the ceramic unit 64 is arranged above the semiconductor light emitting element 48 such that the optical filter 50 is in contact with the upper surface of the semiconductor light emitting element 48, from the upper surface light being emitted. Handling of the light emitting module 70 during manufacture becomes easy by beforehand forming the plate-shaped ceramic unit 64 as stated above. Alternatively, the light diffusion plates 62 may be provided on both surfaces of the light wavelength conversion ceramic 52.

Alternatively, a surface treatment for diffusing light may be performed on the other surface of the light wavelength conversion ceramic 52, instead of the light diffusion plate 62. For example, a surface treatment may be performed on the other surface or both surfaces of the light wavelength conversion ceramic 52 such that the surface (surfaces) is appropriately roughened by forming minute concavities and convexes. Thereby, the non-uniformity of the light emitted by the light emitting module 40 can be suppressed even when the light diffusion plate 62, which is a separate component, is not provided.

Third Embodiment

Figure 6:
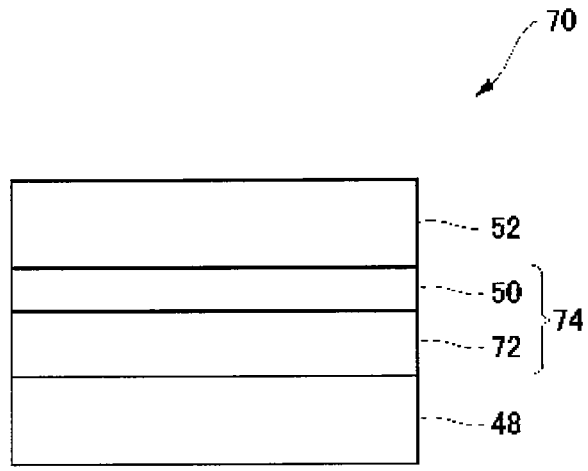
FIG. 6 is a view illustrating the configuration of a light emitting module according to a third embodiment.

FIG. 6 is a view illustrating the configuration of a light emitting module 70 according to a third embodiment. The configuration of the automotive headlamp 10 is the same as that in the first embodiment, except that the light emitting module 70 is provided instead of the light emitting module 40. Hereinafter, the parts similar to the aforementioned embodiment will be denoted with the same reference numerals and descriptions thereof will be omitted.

In the light emitting module 70, a substrate 72 having transparency or translucency formed of quartz is provided between the optical filter 50 and the semiconductor light emitting element 48. The optical filter 50 is first vapor-deposited onto the substrate 72 and an optical filter module 74 is formed. The optical filter module 74 is attached to the semiconductor light emitting element 48 such that the substrate 72 is in contact with the semiconductor light emitting element 48, and the light wavelength conversion ceramics 52 are mounted thereon.

Alternatively, the optical filter 50 may be vapor-deposited onto the upper surface of the semiconductor light emitting element 48. The optical filter 50 can be vapor-deposited onto such the substrate 72 more easily than onto the light wavelength conversion ceramic 52. Both of easy vapor-deposition of the optical filter 50 and simple manufacture of the light emitting module 70 can be achieved by beforehand forming the plate-shaped optical filter module 74 in which the optical filter 50 has been vapor-deposited as stated above.

As the thickness of the substrate 72 becomes larger, there is the fear that light may leak out from the edge of the substrate 72 while the light is transmitting the inside of the substrate 72. As a result of the intensive research and development by the inventors, it has been confirmed that such leak of light from the edge of the substrate 72 can be suppressed by making the thickness of the substrate 72 to be 0.5 mm or less, thereby a decrease in the use efficiency of the light emitted by the semiconductor light emitting element 48 can be properly suppressed. In the third embodiment, a proper thickness smaller than or equal to 0.5 mm is selected such that a curvature is not generated by the heat during the vapor-deposition of the optical filter 50.

Fourth Embodiment

Figure 7:
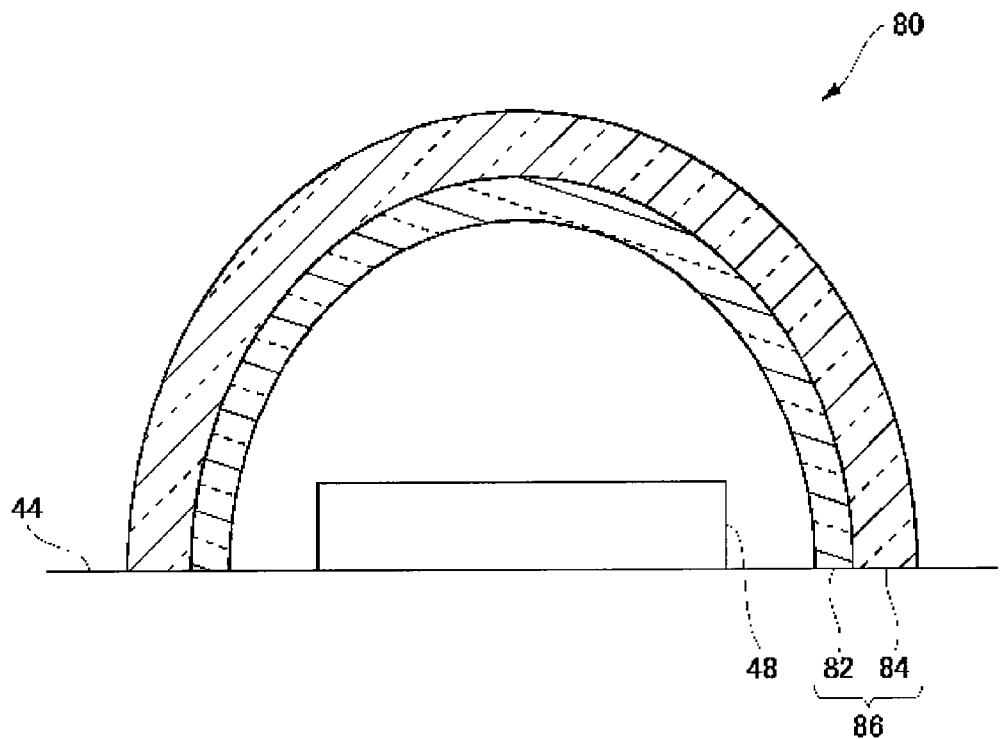
FIG. 7 is a view illustrating the configuration of a light emitting module according to a fourth embodiment.

FIG. 7 is a view illustrating the configuration of alight emitting module 80 according to a fourth embodiment. The configuration of the automotive headlamp 10 is the same as that in the first embodiment, except that the light emitting module 80 is provided instead of the light emitting module 40. Hereinafter, the parts similar to the aforementioned embodiment will be denoted with the same reference numerals and descriptions thereof will be omitted.

The light emitting module 80 has the semiconductor light emitting element 48, an optical filter 82, and a light wavelength conversion ceramic 84. Each of the optical filter 82 and the light wavelength conversion ceramic 84 is formed into a hemispherical shape having an approximately uniform thickness. Each material, etc., of the optical filter 82 and the light wavelength conversion ceramic 84 is the same as that of the optical filter 50 and the light wavelength conversion ceramic 52.

The optical filter 82 is vapor-deposited on the inner surface of the light wavelength conversion ceramic 84 to form a cup-shaped ceramic unit 86. The edge of the ceramic unit 86 is joined to the substrate 44 so as to contain the semiconductor light emitting element 48. The use efficiency of the light that has been emitted in various directions by the semiconductor light emitting element 48 can be enhanced by forming the light wavelength conversion ceramic 84 and the optical filter 82 into hemispherical shapes. Alternatively, the inside of the ceramic unit 86 may be filled with a sealing member. The sealing member may be composed of a light-transmissive resin material, such as, for example, silicone.

Fifth Embodiment

Figure 8:
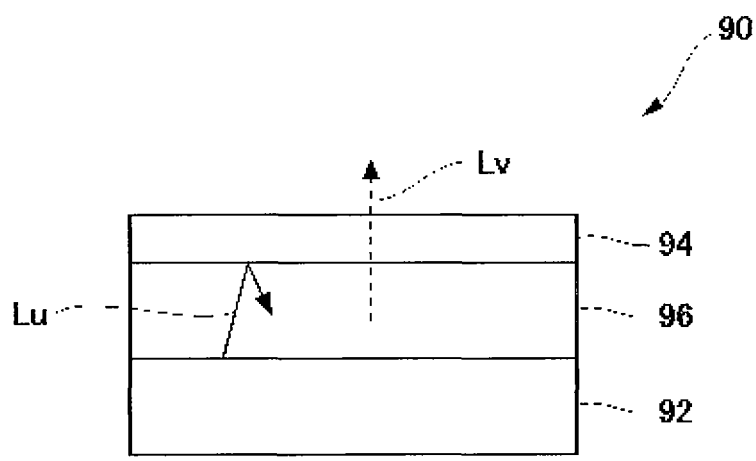
FIG. 8 is a view illustrating the configuration of a light emitting module according to a fifth embodiment.

FIG. 8 is a view illustrating the configuration of alight emitting module 90 according to a fifth embodiment. The configuration of the automotive headlamp 10 is the same as that in the first embodiment, except that the light emitting module 90 is provided instead of the light emitting module 40. Hereinafter, the parts similar to the aforementioned embodiment will be denoted with the same reference numerals and descriptions thereof will be omitted.

The light emitting module 90 has an ultraviolet ray emitting element 92, an optical filter 94, and a light wavelength conversion ceramic 96. The ultraviolet ray emitting element 92 is composed of an LED element emitting ultraviolet rays. Because such an LED element is publicly known, detailed descriptions thereof will be omitted.

The light wavelength conversion ceramic 96, which is a light wavelength conversion member, emits the visible light by being excited with an ultraviolet ray. Because the light wavelength conversion member emitting the visible light by being excited with an ultraviolet ray is publicly known, detailed descriptions of the configuration of the light wavelength conversion ceramic 96 will be omitted.

Although the light wavelength conversion ceramic 96 emits the visible light by being excited with an ultraviolet ray, an ultraviolet ray that transmits the light wavelength conversion ceramic 96 without the wavelength thereof being converted by the light wavelength conversion ceramic 96 can be present. Accordingly, the optical filter 94 is provided in the light emitting module 90. The optical filter 94 is provided, of both surfaces of the light wavelength conversion ceramic 96, on the surface opposite to the surface facing the ultraviolet ray emitting element 92. The optical filter 94 transmits outside the visible light Lv that has been emitted by excitation of the light wavelength conversion ceramic 96. On the other hand, the optical filter 94 suppresses that the ultraviolet light Lu, that is to transmit the light wavelength conversion ceramic 96 as it is, may be radiated outside by reflecting the ultraviolet light. Thereby, it can be suppressed that the ultraviolet light Lu that can be harmful may be discharged outside.

Sixth Embodiment

Figure 9:
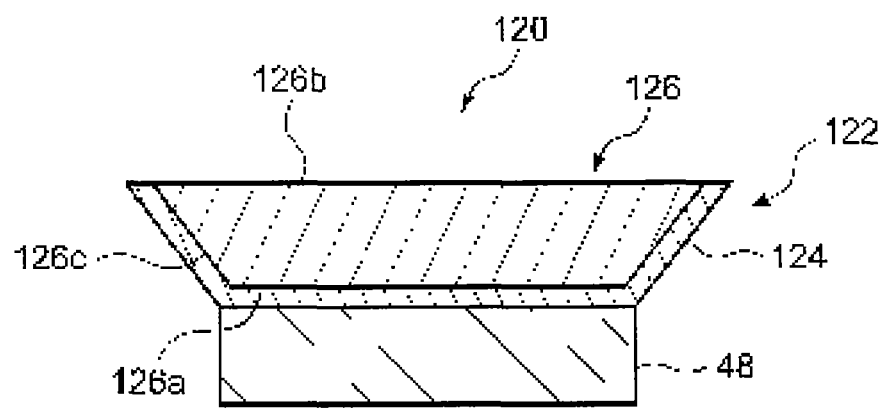
FIG. 9 is a sectional view of a light emitting module according to a sixth embodiment.

FIG. 9 is a sectional view of a light emitting module 120 according to a sixth embodiment. The configuration of the automotive headlamp 10 is the same as that in the first embodiment, except that the light emitting module 120 is provided instead of the light emitting module 40. Hereinafter, the parts similar to the aforementioned embodiment will be denoted with the same reference numerals and descriptions thereof will be omitted.

The light emitting module 120 comprises the semiconductor light emitting element 48 and a ceramic unit 122. The ceramic unit 122 has an optical filter 124 and a light wavelength conversion ceramic 126, which is a light wavelength conversion member. The outer shape of the light wavelength conversion ceramic 126 is formed into a rectangular plate shape with the same material as that of the aforementioned light wavelength conversion ceramic 52. The surfaces of the light wavelength conversion ceramics 126 are composed of the incident surface 126a on which light is to be incident, the emitting surface 126b from which light is to be emitted, and the side surface 126c located between the edge of the incident surface 126a and that of the emitting surface 126b.

The side surface 126c tilts so as to be gradually spaced apart from the center of the light wavelength conversion ceramic 126 toward the emitting surface 126b from the incident surface 126a. Accordingly, the side surface 126c tilts, relative to the emitting surface 126b, at an angle less than 90 degrees, and tilts, relative to the incident surface 126a, at an angle of more than 90 degrees.

The side surface 126c is formed by shaving off the light wavelength conversion ceramic 126 when diced. It is needless to say that a method of forming the light wavelength conversion ceramic 126 such that the side surface 126c tilts should not be limited thereto.

The optical filter 124 also transmits the blue light mainly emitted by the semiconductor light emitting element 48. In addition, the optical filter 124 reflects the yellow light mainly emitted by the light wavelength conversion ceramic 126 that has converted the wavelength of the blue right.

The optical filters 124 are formed on the incident surface 126a and the side surface 126c of the light wavelength conversion ceramics 126. It can be suppressed that light may leak out from the surfaces other than the emitting surface 126b, by proving, of the surfaces of the light wavelength conversion ceramic 126, the optical filters 124 on the surfaces excluding the emitting surface 126b from which light is to be emitted, as stated above. Thereby, the luminance of the light emitted from the emitting surface 126b can be enhanced. Further, the side surface 126c tilts relative to the incident surface 126c, as stated above. Thereby, the light travelling toward the side surface 126c in the light wavelength conversion ceramic 126 can be reflected toward the emitting surface 126b.

In the sixth embodiment, the optical filter 124 is composed of a multi-layered dichroic mirror that has been formed by alternately vapor-depositing and laminating materials having refractive indexes different from each other on the incident surface 126a and the side surface 126c of the light wavelength conversion ceramic 126. The maximum incident angle θ for transmitting the optical filter 124 is the same as the aforementioned optical filter 50. It is needless to say that the optical filter 124 should not be limited thereto. Thus, the optical filter 124 is provided on the plate-shaped light wavelength conversion ceramic 126 to form the ceramic unit 122.

When the light emitting module 120 is to be manufactured, the light wavelength conversion ceramic 126 is provided by dicing the substrate of the light wavelength conversion ceramic 126 so as to form the tilted side surface 126c. Subsequently, the emitting surface 126b of the light wavelength conversion ceramic 126 is masked such that the optical filter 124 is vapor-deposited onto the incident surface 126a and the side surface 126c thereof. Thereafter, the masking is removed. The ceramic unit 122 is formed as stated above.

Subsequently, the ceramic unit 122 is fixed to the semiconductor light emitting module 48 by making, of the optical filter 124, the portion that has been vapor-deposited onto the incident surface 126a of the light wavelength conversion ceramic 126 to be in contact with the light emitting surface of the semiconductor light emitting element 48. Thereby, the incident surface 126a of the light wavelength conversion ceramic 126 and the light emitting surface of the semiconductor light emitting element 48 face each other. The light emitting surface of the semiconductor light emitting element 48 and the incident surface 126a of the light wavelength conversion ceramic 126 respectively have rectangular shapes approximately congruent with each other. The ceramic unit 122 is mounted and fixed to the semiconductor light emitting element 48 such that the edge of the light emitting surface of the semiconductor light emitting element 48 and that of the incident surface 126a of the light wavelength conversion ceramic 126 are overlapped with each other. The ceramic unit 122 is fixed to the upper surface of the semiconductor light emitting element 48 by adhesion. It is needless to say that a method of fixing both of them together should not be limited thereto. Alternatively, a space may be formed between the upper surface of the semiconductor light emitting element 48 and the optical filter 124. Thus, the semiconductor light emitting element 48 and the light wavelength conversion ceramic 126 are arranged such that the light emitted by the semiconductor light emitting element 48 transmits the optical filter 124 to be incident on the incident surface 126a of the light wavelength conversion ceramic 126.

The present invention should not be limited to the above embodiments, and variations in which each component of the embodiments is appropriately combined are also effective as embodiments of the invention. Various modifications, such as design modifications, can be made with respect to the above embodiments based on the knowledge of those skilled in the art. Such modified embodiments can also fall in the scope of the invention.

INDUSTRIAL APPLICABILITY

According to the present invention, the light emitted by a light emitting element can be used effectively, and a manufacturing process for the light emitting module including the light emitting element can be simplified.

The invention claimed is:

1. A light emitting module comprising:
a light emitting element configured to emit a light having a main wavelength within a certain range;
a light wavelength conversion member configured to convert the wavelength of the light emitted by the light emitting element then emit the light; and
an optical filter configured to transmit a light with the main wavelength emitted by the light emitting element and reflect a light with a main wavelength which has been converted by the light wavelength conversion member, wherein
the light wavelength conversion member is formed into a plate shape, wherein
the optical filter is provided on the surface of the light wavelength conversion member and between the light wavelength conversion member and the light emitting element, and wherein
the optical filter has a higher transmittance than a reflectance with respect to the light having a wavelength within a predetermined overlapping wavelength range where the wavelength range of the light emitted by the light emitting element and that of the light converted by the light wavelength conversion member are overlapped with each other, and the maximum incident angle for transmission is 45 degrees or more and less than 90 degrees.

2. The light emitting module according to claim 1, wherein the light emitting element is provided so as to emit a light having a main wavelength within the ultraviolet region.

3. The light emitting module according to claim 1, wherein the optical filters are provided, of the surfaces of the light wavelength conversion member, on the incident surface on which light is to be incident and on the side surface located between the edge of the incident surface and that of the emitting surface from which light is to be emitted, and wherein
the light wavelength conversion member is arranged such that the light emitted by the light emitting element transmits the optical filter to be incident on the incident surface.

4. A method of manufacturing a light emitting module having a light emitting element, comprising:
providing an optical filter that transmits a light having the main wavelength emitted by the light emitting element and reflects a light with a main wavelength which has been converted by a plate-shaped light wavelength conversion member, on at least one surface of the light wavelength conversion member that converts the wavelength of the incident light then emits the light, the optical filter having a higher transmittance than a reflectance with respect to the light having a wavelength within a predetermined overlapping wavelength range where the wavelength range of the light emitted by the light emitting element and that of the light converted by the light wavelength conversion member are overlapped with each other, and the maximum incident angle for transmission being 45 degrees or more and less than 90 degrees; and providing the light emitting element such that the optical filter is provided between the light wavelength conversion member and the light emitting element.

5. The method of manufacturing a light emitting module having a light emitting element according to claim 4, wherein
in the providing an optical filter, the optical filters are provided, of the surfaces of the light wavelength conversion member, on the incident surface on which the light from the light emitting element is to be incident and on the side surface located between the edge of the incident surface and that of the emitting surface from which light is to be emitted, and wherein
in the arranging a light emitting element and a light wavelength conversion member, the light emitting element and the light wavelength conversion member are arranged such that the light emitted by the light emitting element transmits the optical filter to be incident on the incident surface of the light wavelength conversion member.

6. A lamp unit comprising:
a light emitting module including a light emitting element configured to emit a light having a main wavelength within a certain range, a light wavelength conversion member configured to convert the main wavelength of the light emitted by the light emitting element then emit the light, and an optical filter configured to transmit a light with the main wavelength emitted by the light emitting element and reflect a light with a main wavelength which has been converted by the light wavelength conversion member; and
an optical member configured to collect the light emitted from the light emitting module, wherein
the light wavelength conversion member is formed into a plate shape, wherein
the optical filter is provided on the surface of the light wavelength conversion member and between the light wavelength conversion member and the light emitting element, and wherein
the optical filter has a higher transmittance than a reflectance with respect to the light having a wavelength within a predetermined overlapping wavelength range where the wavelength range of the light emitted by the light emitting element and that of the light converted by the light wavelength conversion member are overlapped with each other, and the maximum incident angle for transmission is 45 degrees or more and less than 90 degrees.

7. A light emitting module comprising:
a light emitting element configured to mainly emit a light having a main wavelength within a certain range;
a transparent light wavelength conversion member configured to convert the wavelength of the light emitted by the light emitting element then emit the light; and
an optical filter configured to transmit a light with the main wavelength emitted by the light emitting element and reflect a light with a main wavelength which has been converted by the light wavelength conversion member, wherein
the optical filter is provided between the light wavelength conversion member and the light emitting element and has a higher has a higher transmittance than a reflectance with respect to the light having a wavelength within a predetermined overlapping wavelength range where the wavelength range of the light emitted by the light emitting element and that of the light converted by the light wavelength conversion member are overlapped with each other, and the maximum incident angle for transmission is 45 degrees or more and less than 90 degrees.

8. The light emitting module according to claim 7, wherein
the light wavelength conversion member has 40 percent or more of the total light transmittance of the light with a wavelength within the conversion wavelength range.

9. The light emitting module according to claim 8 further comprising a light diffusion member provided on at least one surface of the light wavelength conversion member.

10. The light emitting module according to claim 8, wherein
the light wavelength conversion member is formed such that light is diffused by at least one surface of the light wavelength conversion member.

11. The light emitting module according to claim 7, wherein
the light emitting element is provided so as to emit a light having a main wavelength within the ultraviolet region.

12. The light emitting module according to claim 7, wherein
the optical filters are provided, of the surfaces of the light wavelength conversion member, on the incident surface on which light is to be incident and on the side surface located between the edge of the incident surface and that of the emitting surface from which light is to be emitted, and wherein
the light wavelength conversion member is arranged such that the light emitted by the light emitting element transmits the optical filter to be incident on the incident surface.

13. A lamp unit comprising:
a light emitting module including a light emitting element configured to emit a light having a main wavelength within a certain range, a transparent light wavelength conversion member configured to convert the wavelength of the light emitted by the light emitting element then emit the light, and an optical filter configured to transmit a light with the main wavelength emitted by the light emitting element and reflect a light with a main wavelength which has been converted by the light wavelength conversion member; and
an optical member configured to collect the light emitted from the light emitting module, wherein
the optical filter is provided between the light wavelength conversion member and the light emitting element and has a higher transmittance than a reflectance with respect to the light having a wavelength within a predetermined overlapping wavelength range where the wavelength range of the light emitted by the light emitting element and that of the light converted by the light wavelength conversion member are overlapped with each other, and the maximum incident angle for transmission is 45 degrees or more and less than 90 degrees.

14. The lamp unit according to claim 13, wherein
the light wavelength conversion member has 40 percent or more of the total light transmittance of the light with a wavelength within the conversion wavelength range.

* * * * *